(12) United States Patent
Sebastiano et al.

(10) Patent No.: US 8,664,941 B2
(45) Date of Patent: Mar. 4, 2014

(54) MAGNETIC SENSOR WITH LOW ELECTRIC OFFSET

(75) Inventors: Fabio Sebastiano, Eindhoven (NL); Robert Hendrikus Margaretha van Veldhoven, Dommelen (NL)

(73) Assignee: NXP B.V., Eindhoven (NL)

( * ) Notice: Subject to any disclaimer, the term of this patent is extended or adjusted under 35 U.S.C. 154(b) by 293 days.

(21) Appl. No.: 13/217,155

(22) Filed: Aug. 24, 2011

(65) Prior Publication Data

US 2013/0049748 A1     Feb. 28, 2013

(51) Int. Cl.
*G01B 7/30* (2006.01)

(52) U.S. Cl.
USPC ............. 324/207.12; 324/207.21; 324/174

(58) Field of Classification Search
USPC ............ 324/207.12, 207.2, 207.21, 174, 252, 324/225
See application file for complete search history.

(56) References Cited

U.S. PATENT DOCUMENTS

| | | | | |
|---|---|---|---|---|
| 6,100,686 | A * | 8/2000 | Van Delden et al. | 324/252 |
| 6,173,501 | B1 * | 1/2001 | Blank et al. | 33/356 |
| 6,232,770 | B1 * | 5/2001 | Schroeder | 324/207.21 |
| 2003/0042894 | A1 * | 3/2003 | Waffenschmidt | 324/207.21 |
| 2008/0111542 | A1 * | 5/2008 | Takahashi et al. | 324/207.25 |
| 2010/0207623 | A1 | 8/2010 | Butzmann et al. | |
| 2010/0219822 | A1 * | 9/2010 | Suzuki et al. | 324/252 |

* cited by examiner

*Primary Examiner* — Jay Patidar (57) ABSTRACT

A magnetic sensing system, including: a magnetic component proximate a movable mechanical component; and a magnetic sensor configured to determine a movement of the mechanical component based on a magnetic field produced by the magnetic component. The magnetic sensor includes: a low-offset magnetic sensing element; a high-sensitivity magnetic sensing element; and an offset compensation circuit configured to: determine a zero-crossing of a sensing field from an output of the low-offset magnetic sensing element; sample an offset value of the high-sensitivity magnetic sensing element at the zero-crossing; and subtract the offset value from an output of the high-sensitivity magnetic sensing element.

19 Claims, 6 Drawing Sheets

MAGNETIC SENSOR WITH LOW ELECTRIC OFFSET

Magnetic sensors used in combination with permanent magnets or other magnetic components may be used to sense the position and speed of a mechanical component. By attaching the magnetic components to the mechanical component or to a magnetic sensor device proximate the mechanical component, rotation or other movement of the mechanical component causes a change in the magnetic field produced by the magnetic components, which can then be detected by the magnetic sensors. Analyzing the output of the sensor and knowing the mechanical construction of the mechanical component allows the frequency of the time varying magnetic field at the magnetic sensor location and the speed of the mechanical component to be determined.

Anisotropic magnetic resistance (AMR) sensors are often used as magnetic field sensors for such applications. AMR sensors generally have relatively high sensitivity compared to other magnetic sensors; however, AMR sensors are typically subject to a large electrical offset. Conventional methods for filtering the offset are often impractical due to size or complexity of the components used to filter the offset, or even loss of information in some applications. Additionally, modulated AMR sensors used to reduce or eliminate offset can introduce noise into the output and reduce sensitivity.

Embodiments of a device are described. In one embodiment, the device is a high-sensitivity magnetic sensor device. The device includes: a low-offset magnetic sensor; a high-sensitivity magnetic sensor; and an offset compensation circuit configured to: determine a zero-crossing of a sensing field from an output of the low-offset magnetic sensor; sample an offset value of the high-sensitivity magnetic sensor at the zero-crossing; and subtract the offset value from an output of the high-sensitivity magnetic sensor. Other embodiments of the device are also described.

Embodiments of a method are described. In one embodiment, the method is a method for magnetic sensing. The method includes: detecting a sensing field using a low-offset magnetic sensor and a high-sensitivity magnetic sensor; determining a zero-crossing of the sensing field from an output of the low-offset magnetic sensor; sampling an offset value of the high-sensitivity magnetic sensor at the zero-crossing; and subtracting the offset value from an output of the high-sensitivity magnetic sensor. Other embodiments of the method are also described.

Embodiments of a system are described. In one embodiment, the system is a magnetic sensing system. The system includes: a magnetic component proximate a movable mechanical component; and a magnetic sensor configured to determine a movement of the mechanical component based on a magnetic field produced by the magnetic component, the magnetic sensor including: a low-offset magnetic sensing element; a high-sensitivity magnetic sensing element; and an offset compensation circuit configured to: determine a zero-crossing of a sensing field from an output of the low-offset magnetic sensing element; sample an offset value of the high-sensitivity magnetic sensing element at the zero-crossing; and subtract the offset value from an output of the high-sensitivity magnetic sensing element. Other embodiments of a system are also described.

Other aspects and advantages of embodiments of the present invention will become apparent from the following detailed description, taken in conjunction with the accompanying drawings, illustrated by way of example of the principles of the invention.

Throughout the description, similar reference numbers may be used to identify similar elements.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

While many embodiments are described herein, at least some of the described embodiments present a system and method for sensing position and speed of mechanical components using magnetic sensors. More specifically, the system uses a two-path architecture that includes a high-sensitivity magnetic sensor and a low-offset magnetic sensor to produce a high-sensitivity, low-offset output. In one embodiment, the system determines a zero-crossing based on the output of the low-offset magnetic sensor, and then samples the output of the high-sensitivity magnetic sensor to determine the offset. The offset may then be subtracted from the output of the high-sensitivity magnetic sensor.

Some conventional solutions filter the offset in an electronic readout of a magnetic sensor. However, in many applications, the signal has components at very low frequency, and the value of the passive components in such a filter, such as resistors and capacitors, are too large to be economical when integrated on silicon. Even if the sensor output signal is directly digitized and the filtering is done in the digital domain such that the sensor does not require large analog circuitry, a large offset may occupy a large part of the dynamic range of an analog-to-digital converter (ADC), increasing the complexity of the ADC. In some applications, the bandwidth of interest includes direct current (DC) and no filtering on the electronic readout is possible without loss of information. Additionally, a very short start-up time may be required. A fast start-up time may not be achieved if low-frequency filtering is employed because the start-up time is then limited by the long time constant of the DC offset-rejecting filter.

Anisotropic Magnetic Resistance (AMR) sensors can be used as magnetic field sensors for embodiments described herein. In AMR sensors, the resistance of one or more resistors varies with the magnetic field present at the sensor. The resistance change is sensed by an electronic frontend and converted into an electrical signal, such as a voltage or a current. Typically, four AMR resistors are used in a resistive bridge. If a constant voltage is used to supply the bridge, the differential output voltage is proportional to the magnetic field. However, due to mismatch between the resistors, a large offset can be present superimposed to the output voltage. To get rid of the offset, modulated AMR sensors are described for use in the system and method described herein. In such sensors, an additional magnetic field is generated at the AMR resistor location. The field is time-varying with a frequency $f_{mod}$. Due to the non-linear response of the AMR resistors to the magnetic field, the field to be sensed (such as the one from a magnetized wheel or any other magnetized mechanical part) and the modulating field are inter-modulated and the output of the sensor frontend has a component proportional to the field to be sensed and with frequency $f_{mod}$. After blocking the DC offset, the signal can be demodulated with frequency $f_{mod}$. As the DC block removes the bridge output offset, the zero-crossings can be easily found by using a comparator. The modulating principle may work in a way similar the chopper technique used to cancel offset of analog frontends, in the sense that the signal of interest is modulated to a region of the spectrum far from DC, where the offset resides.

While modulating an AMR sensor provides an offset-free or low-offset sensor, it may also strongly affect the sensitivity of the sensor. This is because inter-modulation between the sensing field and the modulating field is due to a higher-order term (typically a second-order term) in the AMR response. Since the higher-order term is much smaller than the linear component that is usually exploited in standard unmodulated AMR sensors, the sensitivity of modulated sensors is poorer than that of unmodulated AMR sensors. A lower sensitivity translates to a lower robustness to noise and other disturbances, such as electromagnetic interferences (EMI) or supply ripples. The present system and method are particularly useful in automotive applications and speed sensors, including antilock brake systems, transmission systems, crankshaft systems, and camshaft systems.

Figure 1:
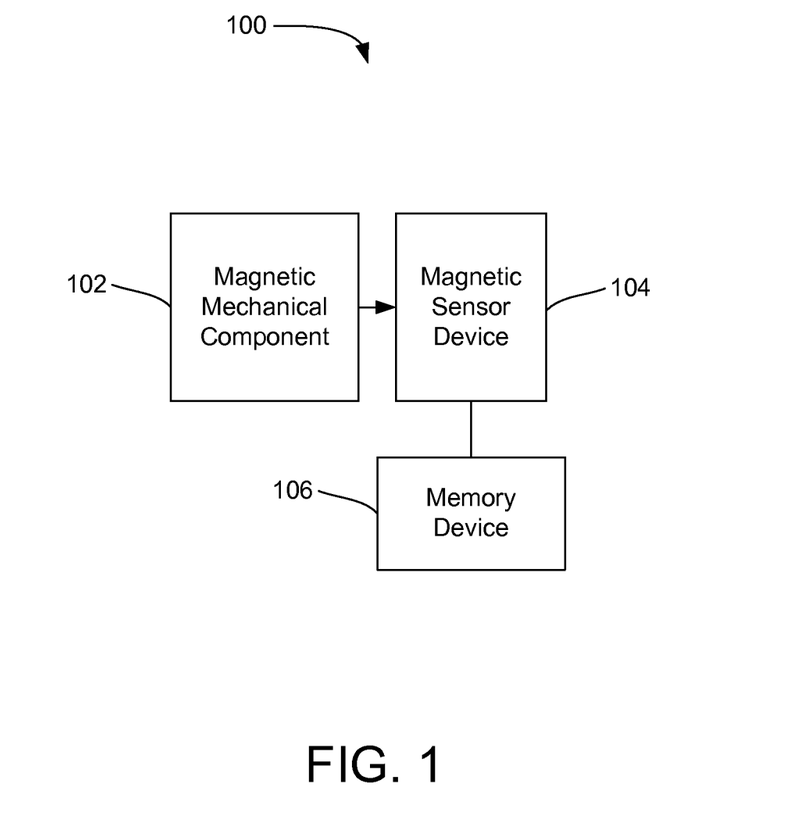
FIG. 1 depicts a schematic diagram of one embodiment of a magnetic sensing system.
Figure 6:
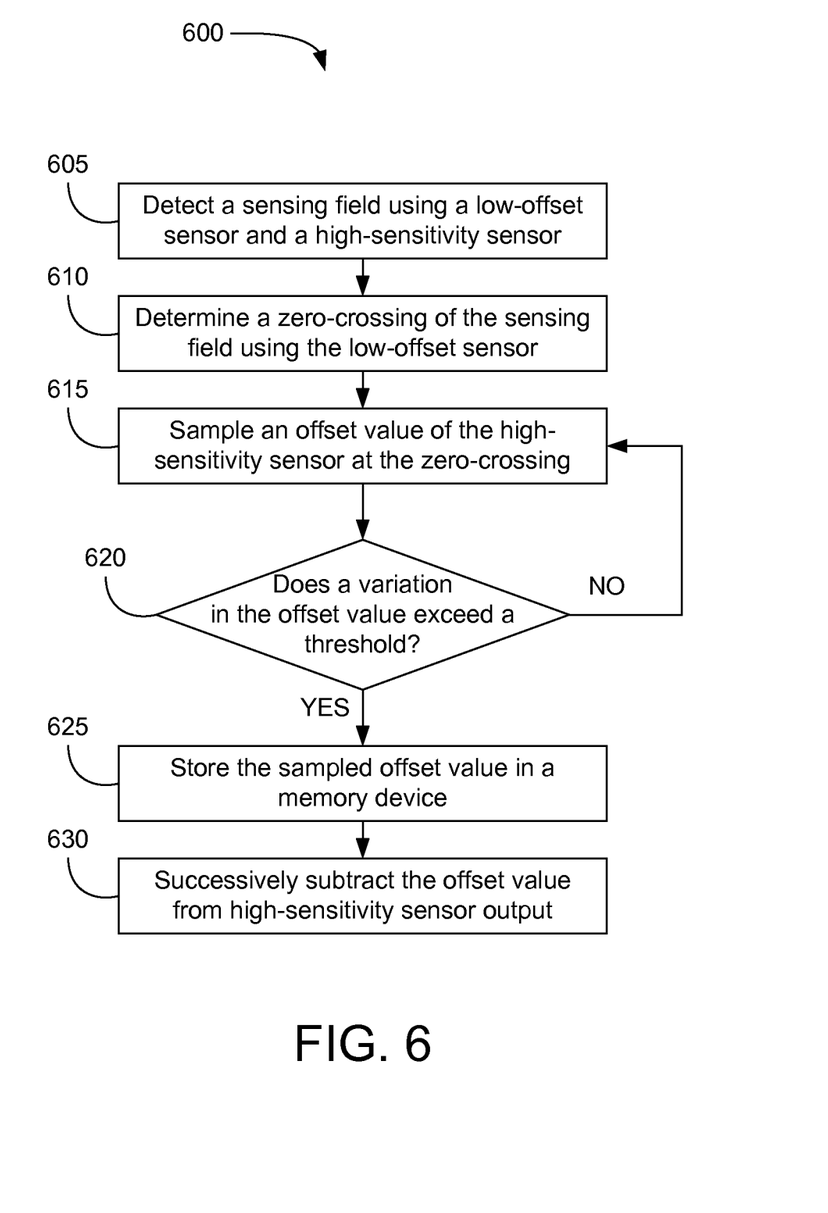
FIG. 6 depicts a flowchart diagram of one embodiment of a method for magnetic sensing.

FIG. 1 depicts a schematic diagram of one embodiment of a magnetic sensing system 100. The depicted magnetic sensing system 100 includes various components, described in more detail below, that are capable of performing the functions and operations described herein. The magnetic sensing system 100 may include various components, such as a magnetic mechanical component 102, a magnetic sensor device 104, and a memory device 106. The magnetic sensing system 100 may include more or fewer components or subsystems than those depicted herein. In some embodiments, the magnetic sensing system 100 may be used to implement the methods described herein as depicted in FIG. 6.

In one embodiment, the magnetic mechanical component 102 is a movable mechanical component 102 that includes one or more permanent magnets or magnetized components. The magnets may be positioned in predetermined locations on the mechanical component 102, such that the location and spacing of each magnet is known. In some embodiments, the exact position of the mechanical component 102 is not known. The magnetic sensor device 104 may be positioned at a close proximity to the mechanical component 102, such that the magnetic sensor device 104 is able to detect the magnetic field produced by the magnets or magnetized components of the mechanical component 102. By detecting and analyzing the changing magnetic field of the mechanical component 102, the magnetic sensing system 100 is able to determine the movement of the mechanical component 102, which may include a position and speed of the mechanical component 102 at any given time.

For example, the mechanical component 102 may be a magnetized wheel whose circumference is divided into sections alternately magnetized as magnetic south and north. A magnetic sensor placed in close proximity to the magnetized wheel may be able to sense a periodic magnetic field as the wheel rotates. Because the mechanical construction (including the position of the magnetized portions) of the wheel is known, the magnetic sensing system 100 is able to determine the frequency of the time varying magnetic field at the location of the magnetic sensing system 100, and consequently, the angular speed of the wheel.

In one embodiment, the magnetic sensing system 100 includes a memory device 106. The memory device 106 may be used to store data from the magnetic sensor device 104. The data stored on the memory device 106 may be retrieved by the magnetic sensor device 104 for later use. In some embodiments, the memory device 106 may be used to store data for other components within the magnetic sensing system 100. In some embodiments, the memory device 106 may be incorporated into a computing device having a processing device. The processing device may utilize data stored on the memory device 106 or data output from the magnetic sensor device 104 to perform various operations.

In other embodiments, the magnetic components may be attached to the magnetic sensor device 104 and proximate the movable mechanical component 102, such that the magnetic components produce a magnetic field based on the movement of the mechanical component 102. The magnetic sensor device 104 is then able to utilize the change in the magnetic field to determine the movement of the mechanical component 102.

Figure 2:
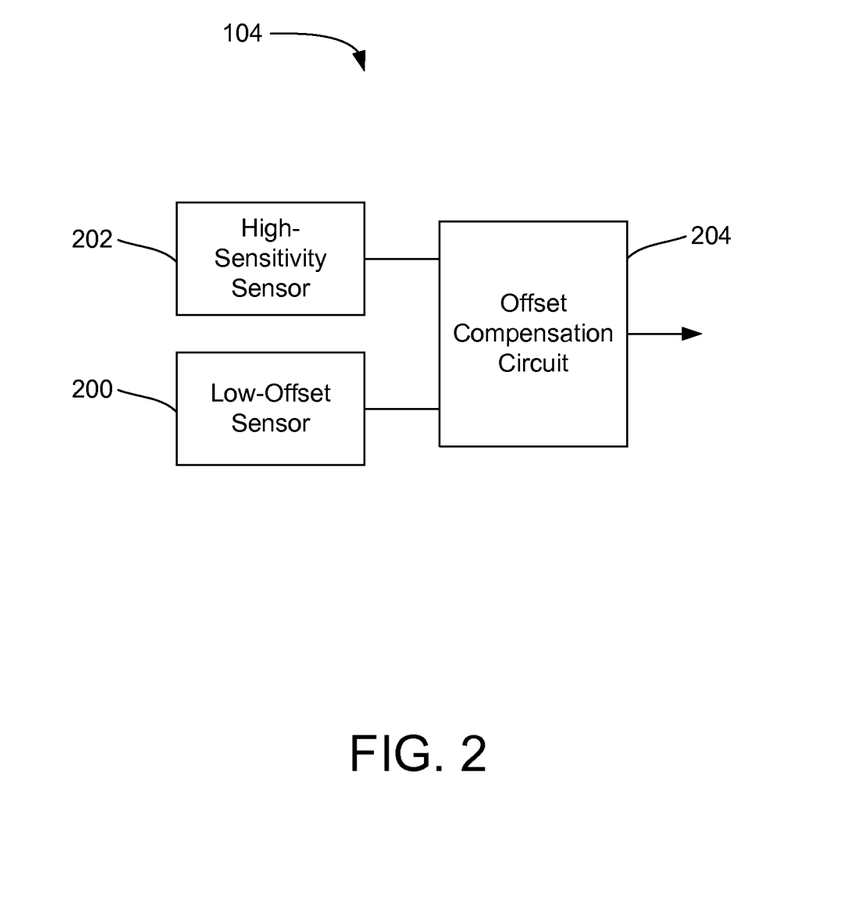
FIG. 2 depicts a schematic diagram of one embodiment of the magnetic sensor device of FIG. 1.

FIG. 2 depicts a schematic diagram of one embodiment of the magnetic sensor device 104 of FIG. 1. While the magnetic sensing system 100 is described herein in conjunction with the magnetic sensor device 104 of FIG. 2, the magnetic sensing system 100 may be used in conjunction with any magnetic sensor device 104.

In one embodiment, the magnetic sensor device 104 includes a low-offset sensor 200 and a main sensor 202. The low-offsetsensor 200 and main sensor 202 produce a sensing field configured to detect the magnetic field produced by the magnetized mechanical component 102. The low-offsetsensor 200 and the main sensor 202 may be positioned within a magnetic field of the mechanical component 102 in any manner such that the magnetic sensor device 104 is able to accurately determine the movement of the mechanical component 102. In one embodiment, the low-offsetsensor 200 and the main sensor 202 are positioned proximate each other. In one embodiment, the low-offsetsensor 200 and the main sensor 202 are positioned such that the sensing field of each does not interfere with the other. In one embodiment, the low-offsetsensor 200 is a modulated AMR sensor. While the main sensor 202 may be a high-sensitivity, unmodulated AMR sensor in some embodiments, the main sensor 202 may be any magnetic sensor.

In one embodiment, the magnetic sensor device 104 includes an offset compensation circuit 204. The offset compensation circuit 204 may be configured to remove or reduce a signal offset of the output from the magnetic sensor device 104. While low-offsetsensors 200, such as modulated AMR sensors, produce offset-free outputs, unmodulated sensors can have an offset in their outputs. Additionally, the offset can change or drift due to temperature variations and aging of the sensor. In one embodiment, the main sensor 202 is a high-sensitivity unmodulated sensor. Implementing the magnetic sensing system 100 using a low-offsetsensor 200 and a high-sensitivity sensor provides a two-path architecture that allows the magnetic sensor device 104 to have a low-offset and high-sensitivity output.

Figure 3:
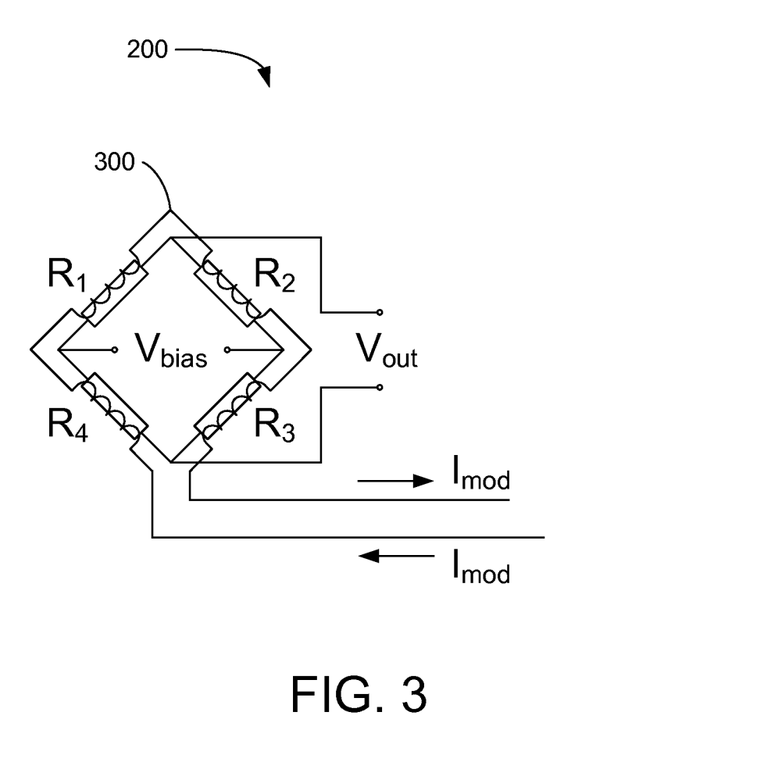
FIG. 3 depicts a schematic diagram of one embodiment of the modulated sensor of FIG. 2.

FIG. 3 depicts a schematic diagram of one embodiment of the modulated sensor 200 of FIG. 2. While the magnetic sensing system 100 is described herein in conjunction with the modulated sensor 200 of FIG. 3, the magnetic sensing system 100 may be used in conjunction with any modulated sensor 200.

Figure 4:
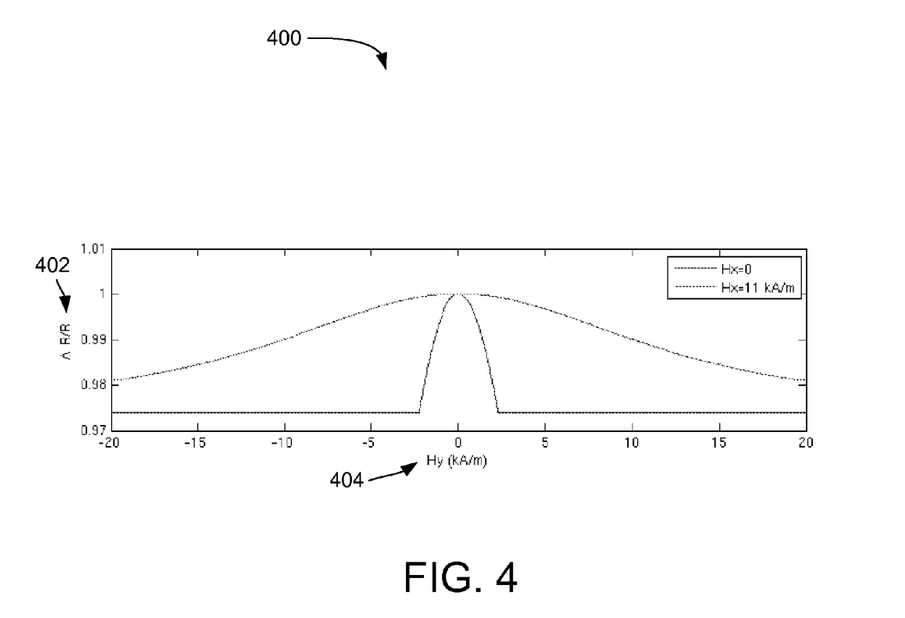
FIG. 4 depicts a graph diagram of one embodiment of magnetic sensor responses.

In one embodiment, the modulated sensor 200 is a modulated AMR sensor 200. The modulated AMR sensor 200 may be a resistive bridge sensor. In the current embodiment, the resistive elements—$R_1$, $R_2$, $R_3$, and $R_4$—are subject to the sensing field $H_y$, which is in the sensitive direction of the sensor. The modulated AMR sensor 200 is also subject to the modulating field $H_m$, which has the same direction as the sensing field $H_y$. The modulating field is generated by coils 300 on top of the modulating sensor, depicted as inductors in FIG. 3. The flow of the current, $I_{mod}$, in the inductors is such that the field at the location of the modulated AMR sensor 200 is equal, respectively, to $H_y+H_m$ for R1 and R3, and to $H_y-H_m$ for R2 and R4. The resistance of a modulated AMR sensor when a magnetic field is applied is given by $$R = R_0[1 + f(H)] \approx R_0\left[1 + a_1 H + \frac{1}{2}a_2 H^2\right]$$

where the response has been approximated with a second-order Taylor expansion. The output voltage is then $$\frac{V_{out}}{V_{bias}} \approx \frac{f(H_y+H_m)-f(H_y-H_m)}{2} \approx 2a_2 H_y H_m + a_1 H_m \approx a_2 H_y H_m$$

where the last approximation is valid when the sensor is dominated by the second-order non-linearity ($a_2 H_y \gg a_1$). The sensitivity is then given by $$S_{mod} = a_2 H_m$$

Where $R_0$ is the baseline resistance of the AMR sensor at zero field (see FIG. 4). H is the applied magnetic field. If the modulating field is a square wave (or a sinusoidal signal), the sensor output is a square wave (or a sinusoid) modulated by the sensing field. The sensitivity is affected by the strength of the applied modulating field and by the $a_2$ coefficient. The $a_2$ coefficient may be made large for a standard AMR sensor, but is limited by practical considerations. A bias magnet producing a field orthogonal to the sensing field is used during operation to bias (stabilize) the AMR sensor. The bias field is used to prevent the sensor from being demagnetized by external interfering magnetic fields.

Linearization of the sensor response is, however, only desired when using the AMR sensor as a linear sensor. When using modulation, the maximum non-linearity may be required, i.e., a large $a_2$ to maximize the sensitivity $S_{mod}$. Since a bias magnet may be required to ensure reliability of the sensor, the sensitivity is reduced with respect to the case without any bias magnet.

FIG. 4 depicts a graph diagram 400 of one embodiment of magnetic sensor responses. The graph diagram 400 shows AMR resistance variation 402 for the AMR sensor relative to the applied field 404 for no bias field and for a bias field. The second order non-linearity described herein corresponding to the modulated AMR sensor 200 is shown, together with the reduction of the non-linearity when a bias field with a typical value of 11 kiloampere per meter (kA/m) is employed.

The sensitivity of a stand-alone modulated AMR sensor 200 is limited by: the strength of the modulating field $H_m$, which is subsequently limited by the power consumption of the driving electronics and the current that can be provided to the coils; and the value of the second-order non-linearity, which is subsequently limited by the magneto-resistance intrinsic physics and reliability concerns (i.e. the bias field).

Figure 5:
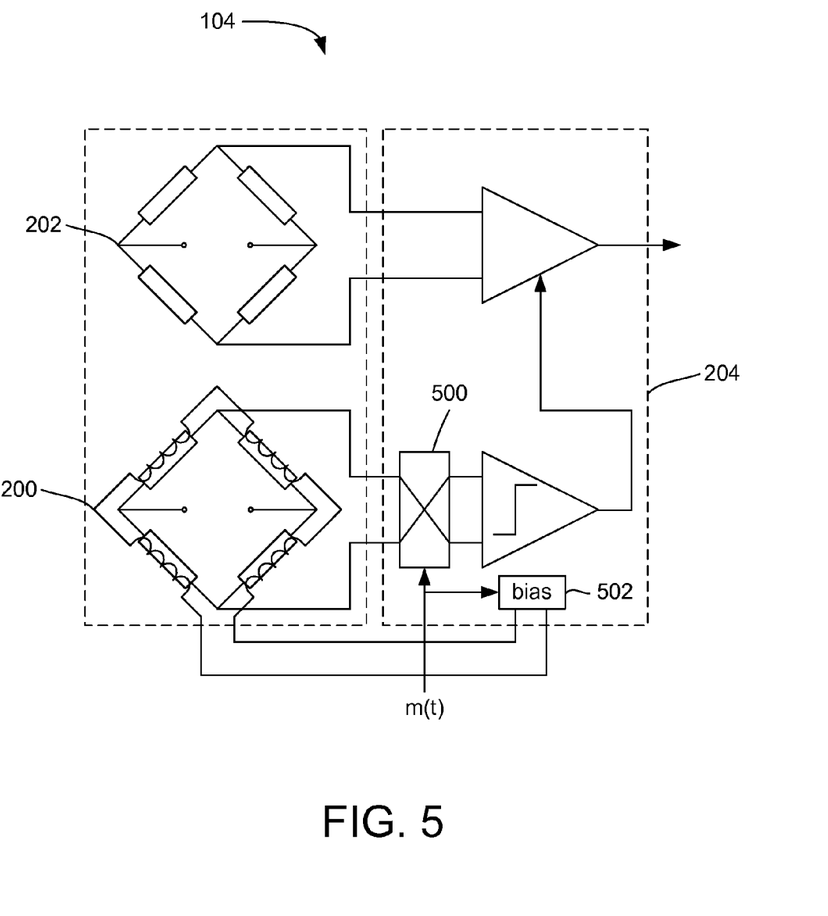
FIG. 5 depicts a schematic diagram of one embodiment of the magnetic sensor device of FIG. 1.

FIG. 5 depicts a schematic diagram of one embodiment of the magnetic sensor device 104 of FIG. 1. While the magnetic sensing system 100 is described herein in conjunction with the magnetic sensor device 104 of FIG. 5, the magnetic sensing system 100 may be used in conjunction with any magnetic sensor device 104.

In one embodiment, the two-path architecture of the magnetic sensor device 104 depicted in FIG. 6 helps improve the reduced sensitivity of the stand-alone modulated sensor 200, while at the same time keeping its offset-free capability. The magnetic sensor device 104 includes two different paths: a low-offset path and a high-sensitivity path. The low-offset path is represented by a low-offset modulated AMR sensor 200 and a comparator 500; the high-sensitivity path is represented by a high-sensitivity standard (unmodulated) AMR sensor 202 and its electronic readout. The comparator 500 and/or other demodulating components at the output of the modulated AMR sensor 200 and the electronic readout of the high-sensitivity AMR sensor 202 may be part of an offset compensation circuit 204 configured to remove the offset from the output of the magnetic sensor device 104.

The waveform m(t) is a modulating signal that is fed to a bias circuit 502, which generates the modulating current for the coils 300, and to the offset compensation circuit 204, which includes a demodulating circuit and filters the offset coming from the sensor and demodulates the signal of interest to DC.

In one embodiment, the output signal of the modulated AMR sensor 200 is sliced by a comparator 500. The switching of the comparator 500 corresponds to a zero-crossing of the sensing field. Since the sensing field is zero at that moment, the output of the magnetic sensor device 104 is equal to the offset of the high-sensitivity AMR sensor 202, i.e., the offset of the cascade of the high-sensitivity AMR sensor 202 and its readout electronics. At the switching of the comparator 500, the offset may be sampled and subtracted from the main sensor 202 output signal, generating an offset-free output. The sampling and the subtraction of the offset can be operated either in the digital domain or in the analog domain. Moreover, because the output is derived from the output of the high-sensitivity AMR sensor 202, the sensitivity of the total system will be equal to the sensitivity of the high-sensitivity path.

However, the output signal of the modulated sensor 200 may be strongly affected by noise because of its poor sensitivity. This may cause the presence of jitter in the timing of the comparator switching and, consequently, an error in the sampling of the offset of the high-sensitivity path. If the offset is re-sampled at each zero-crossing, the noise of the modulated sensor 200 appears at the output, as described below. If $n_{mod}$ is the standard deviation of the input-referred (in the magnetic domain) noise of the modulated sensor 200, the jitter of the comparator switching is $$\sigma_j = \frac{n_{mod}}{\frac{\partial H_y}{\partial t}}$$

Consequently, the input-referred noise of the whole system due to the offset compensation procedure is $$n_{total} = \frac{\partial H_y}{\partial t}\sigma_j = n_{mod}$$

To prevent $n_{mod}$ from dominating the noise of the whole system, different techniques may be applied. A single sampling of the offset may not be sufficient, for example at the first zero-crossing after start-up, because offset can drift due to temperature variations and ageing. In one embodiment, a current offset value is stored in an analog or digital memory device 106 every time the comparator 500 determines a zero-crossing (i.e. when the comparator 500 at the output of the low-offset AMR sensor 200 switches), the output of the high-sensitivity path is sampled and compared to a previously stored value to obtain an offset difference value. If the difference is higher than a predetermined threshold, the current offset value is stored in the memory device 106; otherwise, the current offset value is discarded. The predetermined threshold is chosen so as not to impair the performance of the system, i.e., low enough to meet the offset specifications while following the offset variations (such as offset variations due to temperature variations), and to prevent a fast varying noise component from being added to the output.

In another embodiment, every time a zero-crossing is determined by the comparator 500, an offset value is sampled in the high-sensitivity path and used as the input of a discrete-time low-pass filter. The output of the filter provides the estimation of the offset used for offset compensation. In this way, high frequency components of $n_{mod}$ are rejected. The bandwidth of the low-pass filter is chosen according to the expected dynamics of the offset. In most cases, the fastest variations of the offset are expected to come from temperature variations, which usually have time constants of the order of a few seconds for sensors in typical IC packages. Consequently, only components of $n_{mod}$ up to few Hertz contribute to $n_{total}$. At start-up, the estimated offset is affected by a larger noise, which becomes lower only after the settling of the low-pass filter. Even if filtering is required, a good offset estimation may be provided directly at start-up by using the two-path architecture, while this does not happen when directly filtering the signal to delete the offset.

FIG. 6 depicts a flowchart diagram of one embodiment of a method 600 for magnetic sensing. Although the method 600 is described in conjunction with the magnetic sensing system 100 of FIG. 1, embodiments of the method 600 may be implemented with other types of magnetic sensing systems 100.

In one embodiment, the magnetic sensing system 100 detects 605 a sensing field using two magnetic sensors. The magnetic sensing system 100 includes a low-offset magnetic sensor on a low-offset path and a high-sensitivity magnetic sensor on a high-sensitivity path. In one embodiment, the low-offset magnetic sensor is a modulated AMR sensor 200 that is obtained by stimulating a non-linear magnetic sensor with a modulating field superimposed on the sensing field. In one embodiment, the high-sensitivity magnetic sensor is a standard, unmodulated AMR sensor. In other embodiments, the sensors may be other types of sensors. The magnetic sensing system 100 determines 610 a zero-crossing of the sensing field from the output of the low-offset magnetic sensor. The magnetic sensing system 100 may determine the zero-crossing by detecting a switching of a comparator at the output of the low-offset magnetic sensor. The switching of the comparator corresponds to the zero-crossing of the sensing field.

The magnetic sensing system 100 samples 615 an offset value of the high-sensitivity magnetic sensor at the zero-crossing. In some embodiments, the magnetic sensing system 100 samples the offset value at start-up to achieve an accurate estimate of the offset value for the high-sensitivity magnetic sensor. In some embodiments, the magnetic sensing system 100 also samples the offset value at zero-crossings after start-up to maintain an accurate estimate of the offset value, since the offset value may drift due to various factors affecting the high-sensitivity magnetic sensor, such as temperature or aging of the sensor.

In one embodiment, the magnetic sensing system 100 determines 620 whether a variation in the offset value exceeds a predetermined threshold. The offset compensation circuit 204 in the magnetic sensing system 100 re-samples the offset value in response to detecting a variation in the offset value that exceeds the predetermined threshold. The predetermined threshold may be chosen so as not to impair the performance of the magnetic sensing system 100. The predetermined threshold may be sufficiently low to meet offset specifications while still following the offset variations. The predetermined threshold may also be chosen so as not to add a fast varying noise component to the output of the magnetic sensing system 100.

In one embodiment, the magnetic sensing system 100 captures a current offset value from the output of the high-sensitivity magnetic sensor and compares the current offset value to a previous offset value to obtain an offset difference value. The previous offset value may be retrieved from a memory device 106. The offset difference value indicates the variation in the offset from the previous offset value. The magnetic sensing system 100 stores 625 the current offset value in a memory device 106 in response to the offset difference value exceeding the predetermined threshold. The stored current offset value may then be successively subtracted 630 from the output of the high-sensitivity magnetic sensor until a new offset value is stored in the memory device 106. Re-sampling only when the offset value exceeds the threshold may help reduce the amount of noise introduced into the output of the magnetic sensing system 100.

In one embodiment, the magnetic sensing system 100 subtracts 630 the offset value from the output of the high-sensitivity magnetic sensor to achieve a low-offset or offset-free output for the magnetic sensing system 100. In one embodiment, the magnetic sensing system 100 subtracts from the output of the high-sensitivity magnetic sensor the output of a discrete-time low-pass filter that receives an input of the offset values sampled each time the offset compensation circuit 204 determines a zero-crossing, which may provide an offset estimation characterized by less noise due to the filtering.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A low-offset, high-sensitivity magnetic sensor device, comprising:
   a low-offset magnetic sensor;
   a high-sensitivity magnetic sensor; and
   an offset compensation circuit configured to:
      determining a zero-crossing of a sensing field from an output of the low-offset magnetic sensor;
      sample an offset value of the high-sensitivity magnetic sensor at the zero-crossing; and
      subtract the offset value from an output of the high-sensitivity magnetic sensor.

2. The magnetic sensor device of claim 1, wherein the offset compensation circuit is further configured to re-sample the offset value in response to detecting a variation in the offset value.

3. The magnetic sensor device of claim 2, wherein the variation in the offset value exceeds a predetermined threshold.

4. The magnetic sensor device of claim 3, further comprising a memory device configured to store a previous offset value, wherein the offset compensation circuit is further configured to:
   compare a current offset value to the previous offset value to obtain an offset difference value; and
   store the current offset value in the memory device in response to the offset difference value being larger than the predetermined threshold.

5. The magnetic sensor device of claim 1, wherein the offset compensation circuit comprises a comparator to obtain the zero-crossing of the sensing field from the output of the low-offset magnetic sensor.

6. The magnetic sensor device of claim 1, wherein the low-offset magnetic sensor is a modulated anisotropic magnetic resistance sensor.

7. A method, comprising:
   detecting a sensing field using a low-offset magnetic sensor and a high-sensitivity magnetic sensor;
   determining a zero-crossing of the sensing field from an output of the low-offset magnetic sensor;
   sampling an offset value of the high-sensitivity magnetic sensor at the zero-crossing; and
   subtracting the offset value from an output of the high-sensitivity magnetic sensor.

8. The method of claim 7, further comprising re-sampling the offset value in response to detecting a variation in the offset value.

9. The method of claim 8, wherein the variation in the offset value exceeds a predetermined threshold.

10. The method of claim 9, further comprising:
    comparing a current offset value to a previous offset value to obtain an offset difference value; and
    storing the current offset value in a memory device in response to the offset difference value being larger than the predetermined threshold.

11. The method of claim 7, wherein subtracting the offset value further comprises:
    filtering the output of the high-sensitivity magnetic sensor using a discrete-time low-pass filter,
    wherein the low-pass filter provides an offset estimation based on the offset value sampled from the output of the high-sensitivity magnetic sensor each time the offset compensation circuit determines a zero-crossing.

12. The method of claim 7, wherein determining the zero-crossing further comprises detecting a switching of a comparator at the output of the low-offset magnetic sensor, wherein the switching corresponds to the zero-crossing.

13. The method of claim 7, wherein the low-offset magnetic sensor is a modulated anisotropic magnetic resistance (AMR) sensor.

14. A magnetic sensing system, comprising:
    a magnetic component proximate a movable mechanical component; and
    a magnetic sensor configured to determine a movement of the mechanical component based on a magnetic field produced by the magnetic component, the magnetic sensor comprising:
       a low-offset magnetic sensing element;
       a high-sensitivity magnetic sensing element; and
       an offset compensation circuit configured to:
          determine a zero-crossing of a sensing field from an output of the low-offset magnetic sensing element;
          sample an offset value of the high-sensitivity magnetic sensing element at the zero-crossing; and
          subtract the offset value from an output of the high-sensitivity magnetic sensing element.

15. The magnetic sensing system of claim 14, wherein the offset compensation circuit is further configured to re-sample the offset value in response to detecting a variation in the offset value.

16. The magnetic sensing system of claim 15, further comprising a memory device configured to store a previous offset value, wherein the offset compensation circuit is further configured to:

compare a current offset value to the previous offset value to obtain an offset difference value; and store the current offset value in the memory device in response to the offset difference value being larger than a predetermined threshold.

17. The magnetic sensing system of claim 14, wherein the offset compensation circuit comprises a discrete-time low-pass filter at the output of the high-sensitivity magnetic sensor, wherein the low-pass filter is configured to provide an offset estimation based on the offset value sampled from the output of the high-sensitivity magnetic sensor each time the offset compensation circuit determines a zero-crossing.

18. The magnetic sensing system of claim 14, wherein the offset compensation circuit comprises a comparator to obtain the zero-crossing of the sensing field from the output of the low-offset magnetic sensing element.

19. The magnetic sensing system of claim 14, wherein the low-offset magnetic sensing element is a modulated anisotropic magnetic resistance sensor.

* * * * *